(12) United States Patent
Deng et al.

(10) Patent No.: US 11,508,167 B2
(45) Date of Patent: Nov. 22, 2022

(54) CONVEX REPRESENTATION OF OBJECTS USING NEURAL NETWORK

(71) Applicant: Google LLC, Mountain View, CA (US)

(72) Inventors: Boyang Deng, Toronto (CA); Kyle Genova, Princeton, NJ (US); Soroosh Yazdani, Kitchener (CA); Sofien Bouaziz, Los Gatos, CA (US); Geoffrey E. Hinton, Toronto (CA); Andrea Tagliasacchi, Toronto (CA)

(73) Assignee: Google LLC, Mountain View, CA (US)

( * ) Notice: Subject to any disclaimer, the term of this patent is extended or adjusted under 35 U.S.C. 154(b) by 289 days.

(21) Appl. No.: 16/847,009

(22) Filed: Apr. 13, 2020

(65) Prior Publication Data

US 2021/0319209 A1 Oct. 14, 2021

(51) Int. Cl.
*G06T 17/00* (2006.01)
*G06V 20/64* (2022.01)
*G06N 3/08* (2006.01)
*G06N 3/04* (2006.01)

(52) U.S. Cl.
CPC ........... *G06V 20/64* (2022.01); *G06N 3/0454* (2013.01); *G06N 3/08* (2013.01); *G06T 17/00* (2013.01)

(58) Field of Classification Search
CPC .................. G06T 17/00–30; G06N 3/0454
See application file for complete search history.

(56) References Cited

U.S. PATENT DOCUMENTS 11,030,474 B1 * 6/2021 Buchaca ................. G06T 19/20

OTHER PUBLICATIONS

Chen et al "BSP-NET: generation compact meshes via binary space partitioning" arXiv:1911.06971V1 Nov. 2019 (Year: 2019).*
Achlioptas et al, "Learning representations and generative models for 3d point clouds" International Conference on Machine Learning, 2018, 18 pages.
Angles et al, "Sketch-based implicit blending" ACM Transaction on Graphics, 2017, 13 pages.
Berger et al, "A survey of surface reconstruction from point clouds" Computer Graphics Forum, 2017, 28 pages.
Biederman, "Recognition-by-components: a theory of human image understanding" Psychological review, 1987, 33 pages.
Blanz et al, "A morphable model for the synthesis of 3D faces" ACM Trans. On Graphics, 1999, 8 pages.
Blinn, "A generalization of algebraic surface drawing" ACM Trans. On Graphics, 1982, 22 pages.
Bogo et al, "Keep it smpl: Automatic estimation of 3D human pose and shape from a single image" arXiv, 2016, 18 pages.
Brock et al, "Generative and discriminative voxel modeling with convolutional neural networks" arXiv, 2016, 9 pages.

(Continued)

*Primary Examiner* — Sean T Motsinger
(74) *Attorney, Agent, or Firm* — Fish & Richardson P.C.

(57) ABSTRACT

Methods, systems, and apparatus including computer programs encoded on a computer storage medium, for generating convex decomposition of objects using neural network models. One of the methods includes receiving an input that depicts an object. The input is processed using a neural network to generate an output that defines a convex representation of the object. The output includes, for each of a plurality of convex elements, respective parameters that define a position of the convex element in the convex representation of the object.

31 Claims, 4 Drawing Sheets

(56) References Cited

OTHER PUBLICATIONS

Bronstein et al, "Geometric deep learning going beyond euclidean data" IEEE Signal Processing Magazine, 2017, 22 pages.
Chang et al, "Shapenet: An information-rich 3d model repository" arXiv, 2015, 11 page.
Chazelle, "Convex decompositions of polyhedra" Proceedings of the 13th annual ACM symposium on Theory of computing, 1981, 10 pages.
Chen et al, "Bae-net: Branched autoencoder for shape co-segmentation" Proceedings of the International Conference on Computer Vision, 2019, 10 pages.
Chen et al, "Learning implicit fields for generative shape modeling" Proc. Of Comp. Vision and Pattern Recognition, 2019, 10 pages.
Choy et al, "3d-r2n2: A unified approach for single and multi-view 3d object reconstruction" Proc. Of the European Conf. on Comp. Vision, 2016, 17 pages.
Dong et al, "Multi-robot collaborative dense scene reconstruction" ACM Trans. on Graphics, 2019, 16 pages.
Fan et al, "A point set generation network for 3d object reconstruction from a single image" Proceedings of the IEEE conference on computer vision and pattern recognition, 2017, 9 pages.
Gadelha et al, "3d shape induction from 2d views of multiple objects" International Conference on 3D vision, 2016, 11 pages.
Genova et al, "Learning shape templates with structured implucut functions" arXiv, 2019, 12 pages.
Ghosh et al, "Fast approximate convex decomposition using relative concavity" Computer-Aided Design, 2013, 11 pages.
Gilbert et al, "A fast procedure for computing the distance between complex objects in three-dimensional space" IEEE Journal on Robotics and Automation, 1988, 11 pages.
Girdhar et al, "Learning a predictable and generative vector representation for objects" arXiv, 2016, 26 pages.
Graham, "A efficient algorithm for determining the convex hull of a finite planar set" Info. Pro. Lett., 1972, 2 pages.
Groueix et al, "A papier-mache approach to learning 3d surface generation" Proc. Of Comp. Vision and Pattern Recognition, 2018, 9 pages.
Guo et al, "3d mesh labeling via deep convolutional neural networks" ACM Transactions on Graphics, 2015, 12 pages.
Heiden et al, "Real2sim transfer using differentiable physics" Workshop on Closing the Reality Gap in Sim2real Transfer for Robotic Manipulation, 2019, 2 pages.
Heiden et al, "Interactive differentiable simulation" arXiv, 2019, 11 pages.
Hoppe et al, "Surface reconstruction from unorganized points" ACM SIGGRAPH Computer Graphics, 1992, 8 pages.
Kanazawa et al, "Learning cateogry-specific mesh reconstruction from image collections" Proc. Of the European Conf. on Comp. Vision, 2018, 16 pages.
Kong et al, "Using locally corresponding cad models for dense 3d reconstructions from a single image" Proc. Of Comp. Vision and Pattern Recognition, 2017, 9 pages.
Laidlaw et al, "Constructive solid geometry for polyhedral objects" ACM Trans. On Graphics, 1986, 9 pages.
Leung et al, "Neural networks for convex hull computation" IEEE Transactions on Neural Networks, 1997, 11 pages.
Liao et al, "Deep marching cubes: Learning explicit surface representations" Proc. Of Comp. Vision and Pattern Recognition, 2018, 10 pages.
Lin et al, "Learning efficient point cloud generation for dense 3d object reconstruction" 32nd AAAI Conference on Artificial Intelligence, 2018, 8 pages.
Liu et al, "Nearly convex segmentation of polyhedra through convex ridge separation" Computer-Aided Design, 2016, 10 pages.
Mamou et al, "A simple and efficient approach for 3d mesh approximate convex decomposition" 16th IEEE International Conference on image processing, 2009, 4 pages.
Masci et al, "Geodesic convolutional neural networks on riemannian manifolds" Proceedings of the IEEE international conference on computer vision workshops, 2015, 9 pages.
Maturana et al, "Voxnet: A 3d convolutional neural network for real-time object recognition" IEEE International Conference on Intelligent Robots and Systems, 2015, 7 pages.
Mescheder et al, "Occupancy networks: Learning 3d reconstruction in function space" arXiv, 2018, 11 pages.
Mo et al, "Partnet: A large-scale benchmark for fine-grained and hierarchical part-level 3d object understanding" Proceedings of the IEEE Conference on Computer Vision and Pattern Recognition, 2019, 10 pages.
Monti et al, "Geometric deep learning on graphs and manifolds using mixture model cnns" Proc. Of Comp. Vision and Pattern Recognition, 2017, 10 pages.
Newcombe et al, "Dynamicfusion: Reconstruction and tracking of non-rigid scenes in real-time" Proceedings of the IEEE conference on computer vision and pattern recognition, 2015, 10 pages.
Newcombe et al, "Kinectfusion: Real-time dense surface mapping and tracking" Proc. ISMAR, 2011, 66 pages.
Park et al, "Deepsdf Learning continuous signed distance functions for shape representation" arXiv, 2019, 10 pages.
Paschalidou et al, "Superquadrics revisited: Learning 3d shape parsing beyond cuboids" Proceedings IEEE Conf. on Computer Vision and Pattern Recognition, 2019, 10 pages.
Preparata et al, "Convex hulls of finite sets of points in two and three dimensions" Commuications of the ACM, 1977, 7 pages.
Qi et al, "Deep learning on point sets for 3d classification and segmentation" Proceedings of the IEEE Conference on Computer Vision and Pattern Recognition, 2017, 9 pages.
Qi et al, "Volumetric and multi-view cnns for object classification on 3d data" Proceedings of the IEEE conference on computer vision and pattern recognition, 2016, 9 pages.
Qi et al, "Pointnet++: Deep hierarchical feature learning on point sets in a metric space" Advances in Neural Information Processing Systems, 2017, 10 pages.
Ranjan et al, "Generating 3d faces using convolutional mesh autoencoders" Proceedings of the European Conference on Computer Vision, 2018, 17 pages.
Rezende et al, "Unsupervised learning of 3d structure from images" Advances in Neural Information Processing Systems, 2016, 9 pages.
Riegler et al, "Octnet Learning deep 3d representations at high resolutions" Proceedings of the IEEE Conference on Computer Vision and Pattern Recognition, 2017, 10 pages.
Roberts, "Machine perception of three-dimensional solids" PhD thesis, 82 pages.
Sharma et al, "Csgnet: Neural shape parser for constructive solid geometry" Oric. Of Comp. Vision and Pattern Reconigion, 2018, 9 pages.
Song et al, "Deep sliding shapes for amodal 3d object detection in rgb-d images" Proceedings of the IEEE Conference on Computer Vision and Pattern Recognition, 2016, 9 pages.
Stutz et al, "Learning 3d shape completion from laser scan data with weak supervision" Proceedings of the IEEE Conference on Computer Visiona and Pattern Recognition, 2018, 10 pages.
Sun et al, "Attentive contect normalization for robust permutation-equivariant learning" arXiv, 2019, 13 pages.
Tatarchenko et al, "Octree generating networks Efficient convolutional architectures for high-resolution 3d outputs" Proceedings of the IEEE Intemaional Conference on Computer Vision, 2017, 9 pages.
Tatarchenko et al, "What do single-view 3d reconstruction networks learn?" Proceedings of the IEEE Conference on Computer Vision and Pattern Recognition, 2019, 10 pages.
Thul et al, "Approximate convex decomposition and transfer for animater meshes" SIGGRAPH Asia 2018 Technical Papers, 2018, 10 pages.
Tkach et al, "Sphere-meshes for real-time hand modeling and tracking" ACM Transaction on Graphics, 2016, 11 pages.
Tulsiani et al, "Learning shape abstractions by assembling volumetric primitivies" Proceedings of the IEEE Conference on Computer Vision and Pattern Recognition, 2018, 9 pages.

(56) References Cited

OTHER PUBLICATIONS

Ulusoy et al, "Towards probabilistic volumetric reconstruction using ray potentials" International Conference on 3D Vision. 2015, 9 pages.
Van den Hengel et al, "Part-based modelling of compound scenes from images" Proc. Of Cmp. Vision and Pattern Recognition, 2015, 9 pages.
Wang et al, "Pixel2mesh: Generating 3d mesh models from single rgb images" Proc. Of the European Conf. on Comp. Vision, 2018, 16 pages.
Wang et al, "O-cnn: Octree-based convolutional neural networks for 3d shape analysis" ACM Transactions on Graphics, 2017, 11 pages.
Wang et al, "Adaptive o-cnn: a patch-based deep representation of 3d shapes" SIGGRAPH Asia 2018 Technical Papers, 2018, 12 pages.
Wu et al, "Learning a probabilistic latent space of object shapes via 3d generative-adversarial modeling" Advances in neural information processing systems, 2016, 9 pages.
Wu et al, "3d shapenets: A deep representation for volumetric shapes" Proc. Of Comp. Vision and Pattern Recognition, 2015, 9 pages.
Yu et al, "Partnet: A recursive part decomposition network for fine-grained and hierarchical shape segmentation" Proc. Of Comp. Vision and Pattern Recognition, 2019, 10 pages.
Zou et al, "3d-prnn: Generating shape primitives with recurrent neural networks" Proceedings of the IEEE International Conference on Computer Vision. 2017, 10 pages.

\* cited by examiner

CONVEX REPRESENTATION OF OBJECTS USING NEURAL NETWORK

BACKGROUND

This specification generally relates to convex representation of objects.

Conventionally, there are several methods to represent objects. Three-dimensional (3D) objects can be represented in voxel grids, but this method may be unsuitable for high resolution representations due to high memory requirement. Polygonal meshes can be used to represent 3D objects in computer graphics. Point clouds can represent surfaces of 3D objects, especially if information of an object is acquired using sensors such as depth cameras or LiDar sensors.

Neural networks are machine learning models that employ one or more layers of nonlinear units to predict an output for a received input. Some neural networks include one or more hidden layers in addition to an output layer. The output of each hidden layer is used as an input to the next layer in the network, i.e., the next hidden layer or the output layer. Each layer of the network generates an output from a received input in accordance with current values of a respective set of parameters.

SUMMARY

This specification describes technologies for generating convex decomposition of objects using neural network models.

In general, one innovative aspect of the subject matter described in this specification can be embodied in methods that include the actions of receiving an input that depicts an object; and processing the input using a neural network to generate an output that defines a convex representation of the object, wherein the output comprises, for each of a plurality of convex elements, respective parameters that define a position of the convex element in the convex representation of the object. Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on its software, firmware, hardware, or a combination of them that in operation cause the system to perform the operations or actions. For one or more computer programs to be configured to perform particular operations or actions means that the one or more programs include instructions that, when executed by a data processing apparatus, cause the apparatus to perform the operations or actions.

In general, another innovative aspect of the subject matter described in this specification can be embodied in a method of training a neural network that receives an input that depicts an object and processes the input to generate an output that defines a convex representation of the object, wherein the output comprises, for each of a plurality of convex elements, respective parameters that define a position of the convex element in the convex representation of the object. The method includes the actions of receiving a training input that depicts an object; processing the training input using the neural network to generate a training output that defines a convex representation of the object; sampling a plurality of points on the training input; for each sampled point, generating a ground truth indicator value using the training input, and a training indicator value using the convex representation of the object, wherein the ground truth indicator value determines whether the sampled point lies inside the object, and wherein the training indicator value determines whether the sampled point lies inside the convex representation of the object; and determining an update to values of parameters of the neural network by minimizing a loss function that depends on a distance between the ground truth indicator value and the training indicator value. Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on its software, firmware, hardware, or a combination of them that in operation cause the system to perform the operations or actions. For one or more computer programs to be configured to perform particular operations or actions means that the one or more programs include instructions that, when executed by a data processing apparatus, cause the apparatus to perform the operations or actions.

The subject matter described in this specification can be implemented in particular embodiments so as to realize one or more of the following advantages. An object can be represented using a small number of convex elements that are generated using a neural network. Each convex element is defined by a collection of half-space constraints. This representation is a low-dimensional convex decomposition representation that can be automatically inferred from the input object, without any human supervision. The neural network can be trained in a self-supervised manner, by checking whether the reconstructed geometry matches the geometry of the object. This convex representation can be trained on a shape collection and can result in convex elements that have a semantic association, e.g., the same elements are used to represent the same parts of objects. Each of the convex elements is not restricted to belong to a specific class of shapes, e.g., boxes, ellipsoids, sphere-meshes, but to the more general class of convexes.

Because each convex element is defined by a collection of half-space constraints, the convex representation can be decoded into an explicit representation, e.g., polygonal mesh, as well as an implicit representation, e.g., analytic surfaces and implicit indicator functions. Therefore, a polygonal mesh representation can be directly generated from the output of the neural network. Traditional methods require a conversion of an implicit function to a mesh representation, which requires execution of iso-surfacing algorithms (e.g., marching cubes). The execution of iso-surfacing algorithms can be slow and non-scalable and is not suitable for real-time applications. Compared with the traditional methods, the subject matter described can generate a polygonal mesh representation much faster and in a scalable fashion, and is much more suitable for real-time applications.

In many computer graphics pipelines, e.g., physics simulations, computing a convex decomposition can be a necessary task that is traditionally done either by hand, i.e., by an artist, or with computationally intensive routines which can take seconds to generate one decomposition. The subject matter described can efficiently provide a convex decomposition as the output of the neural network, without requiring post-processing.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
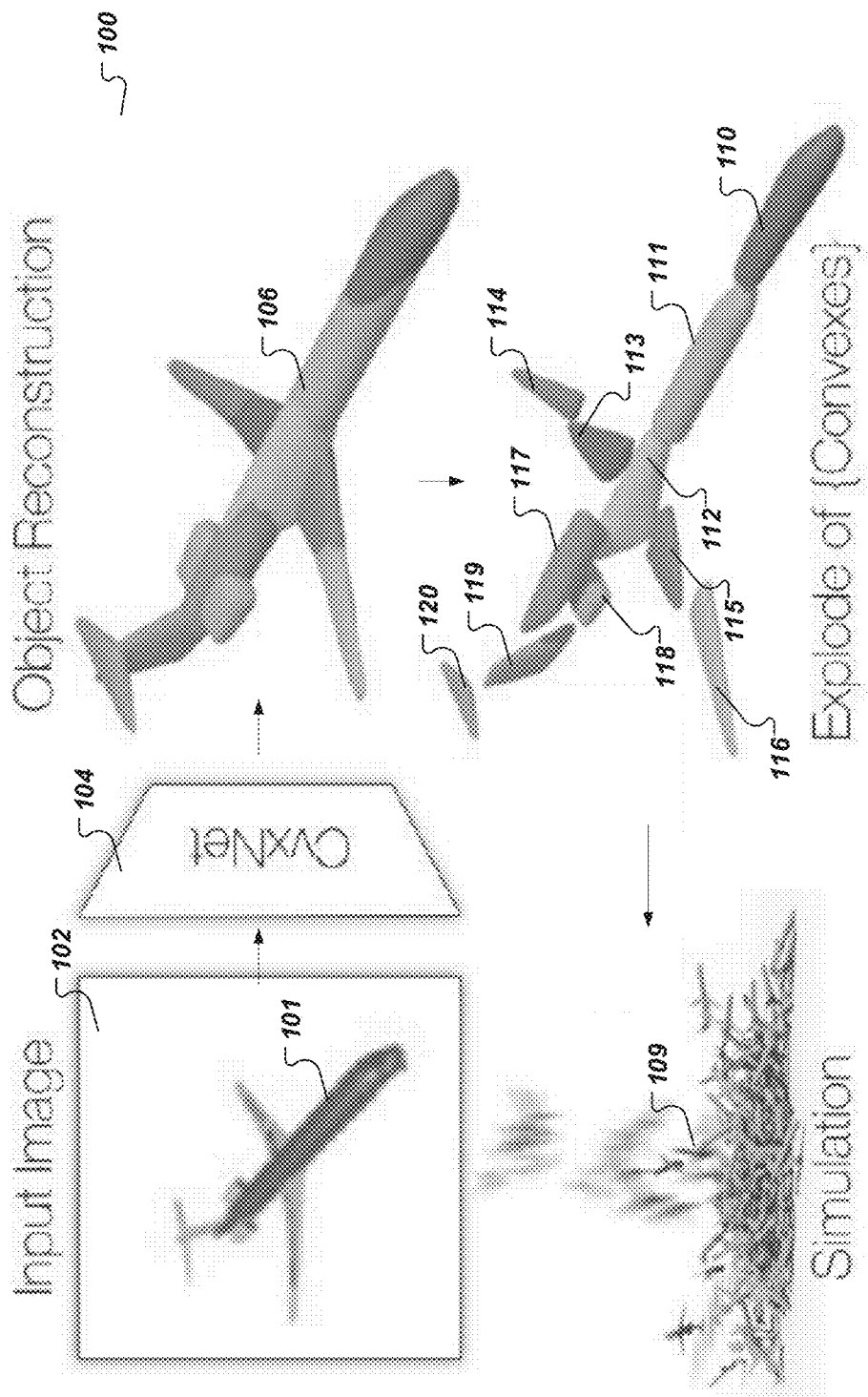
FIG. 1 shows an example system that generates convex representation of an object.

FIG. 1 shows an example system 100 that generates convex representation of an object. The system 100 is an example of a system implemented as computer programs on one or more computers in one or more locations, in which the systems, components, and techniques described below can be implemented.

The system 100 receives an input 102 that depicts an object 101. The input can be a representation of the object in any format, e.g., an image, point cloud, or voxel grid, that describes shape information of an object. The object can be a two-dimensional (2D) object or a three-dimensional (3D) object. For example, as shown in FIG. 1, the input 102 is an image of a 3D object, i.e., an airplane 101. In some applications, the input object can be various types of chairs, cars, persons, animals, etc., and any other 2D or 3D objects.

A convex decomposition neural network (CvxNet) 104 processes the input 102 and generates a convex decomposition 106 of the object 101 depicted in the input 102. In general, a complex object can be partitioned into pieces that are easier for subsequent processing. The convex decomposition, i.e., convex representation, of the object can include pieces that have convex shapes. These convex pieces can also be called convex elements. The convex decomposition of the object can approximate the geometry of the object by using a plurality of convex elements.

The neural network 104 is a neural network that is trained to output a convex decomposition of an object depicted in the input.

For example, the neural network 104 can be a neural network with an encoder-decoder architecture. The encoder-decoder architecture can be configured to generate a plurality of convex elements to approximate the input object 101. The architecture of the convex decomposition neural network 104 is described in more detail below with reference to FIG. 2.

In more detail, the output of the neural network 104 defines a convex decomposition 106 of the object 101 in the input 102. Generally, an object can be represented by, i.e., decomposed into, a collection of convex elements. A convex element has a convex shape and is an approximation to a part of the object. When a small number of convex elements are used, such a representation can be a piecewise approximation of the object. This representation is important to real-time computer graphics applications (e.g., physics simulation) because the convex representation can create a unified representation of dynamic geometries of different objects.

The convex decomposition 106 includes a plurality of convex elements that can approximate the shape of the 2D or 3D object. The total number of convex elements can be a predetermined number or can be a number that is determined by the neural network. For example, as shown in an exploded view in FIG. 1, the convex decomposition 106 of the airplane 101 includes eleven convex elements 110, 111, 112, 113, 114, 115, 116, 117, 118, 119 and 120. Each convex element corresponds to a part of the airplane. For example, convex elements 113 and 114 can represent the left wing of the airplane, and convex elements 115 and 116 can represent the right wing of the airplane.

The neural network 104 can be configured to generate parameters that define a position of the convex element in the convex representation of the object. The total number of parameters that define the position of the convex element can be a predetermined number or can be a number that is determined by the neural network. For example, the neural network 104 can be configured to generate pose parameters that define that the position of the convex element 110 is at the foremost location in the front, such that the convex element 110 can represent the front of the airplane.

In some implementations, the neural network 104 can be configured to generate parameters that define a shape of the convex element. For example, the neural network 104 can be configured to generate parameters that define a cylindrical shape of the convex element 111 such that the convex element 111 can approximate the mid-body of the airplane 101.

In some implementations, each of the convex elements can be defined by a plurality of halfspaces. The neural network can be configured to generate a predetermined number of halfspaces. In more detail, the neural network can be configured to generate parameters that define the halfspace, e.g., a normal parameter and an offset parameter. For example, three oriented straight lines, each of which defines a halfspace in 2D, can define a triangle shaped convex element.

The neural network 104 can be configured to generate a large number of halfspaces. Therefore, each of the convex elements is not restricted to belong to a specific class of shapes, e.g., boxes, ellipsoids, sphere-meshes, but to the more general class of convexes. In other words, the generated convex elements can be different from each other. Each convex element can be any convex shape that can provide an approximation to a part of the object. For example, the eleven convex elements 110 to 120 have shapes that are different from each other, and each convex element can represent a part of the airplane that has a unique shape.

Using the neural network 104, a shape of the airplane 101 can be represented by a small number of convex elements, allowing a low-dimensional representation to be automatically inferred from the input image, without any human supervision.

The convex decomposition 106 can be used for downstream applications, such as physical simulation, surface reconstruction, etc. For example, the generated convex decomposition can be used in real-time physical simulations, such as simulating a process when an object is falling under gravity, or simulating a process and a result of collisions between two or more objects, etc. Examples of other applications that can use a convex decomposition of an object can include automatic convex decomposition of complex objects, image to 3D reconstruction, part-based shape retrieval, and so on.

For example, a real-time collision simulation 109 can simulate a scenario when hundreds of airplanes drop from the sky to the ground and collide with each other. Each airplane in the collision simulation 109 can be represented as a small number of convex elements, similar to the convex decomposition 106 of the airplane 101. Because an airplane geometry of each airplane object has been decomposed into a small number of convex elements, the collision simulation 109 can be efficiently calculated by computing the collision behavior of the convex elements using physics engines.

Figure 2:
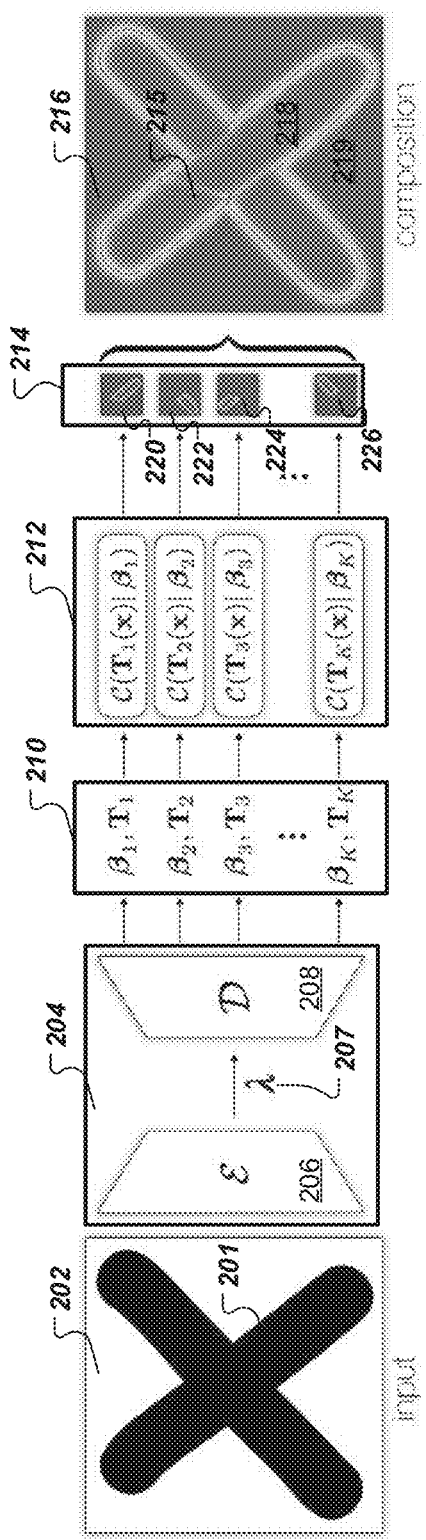
FIG. 2 illustrates an example architecture of a convex decomposition neural network for generating a convex representation of an object.

FIG. 2 illustrates an example architecture of a convex decomposition neural network 200 that can be used to generate a convex representation of an object. The convex decomposition neural network takes an input that depicts an object, processes the input, and generates an output that defines a convex representation of the object. The convex representation can approximate the object as a composition of convex elements.

The network 200 takes an input that depicts an object. The object can be a 2D object or a 3D object of any arbitrary shape that is either convex or concave. For example, the 2D binary image 202 illustrates the geometry of a 2D object 201 with a shape like the letter "X". The "X" shaped object 201 can be represented in black color on a white background in a 2D input image. The "X" shaped object 201 has a non-convex shape. In real-life, many objects are non-convex, such as the shapes of an animal, a person, a desk, a truck, etc. The example object 201 in FIG. 2 is a simplified example used to illustrate decomposing non-convex objects into convex elements by the network 200.

The input can be a representation of the object in any format. In some implementations, the input can be a voxel grid representation of an object. In some implementations, the input can be a point cloud representation of an object captured by one or more sensors, such as depth cameras or LiDar sensors.

The network 200 can include an encoder-decoder neural network 204 that takes the input 202 and outputs a plurality of parameters 210 that define a convex representation of the object 201 in the input 202. Encoder-decoder is a type of neural network used to learn efficient encoded representation of an input via dimensionality reduction. An encoder-decoder architecture includes two parts: an encoder that maps an input into an encoded representation, and a decoder that maps the encoded representation to a desired output that is related to the input. The encoder-decoder neural network 204 can include an encoder neural network 206 and a decoder neural network 208.

The encoder neural network 206 can be configured to receive an input 202 and to generate a low-dimensional latent representation 207 of the input. The latent representation 207 can be a set of features that represent properties of the input in a latent space, a feature space that is different from the image space in the input image 202. The latent representation 207 can be low-dimensional because the set of features is a more abstract and compact representation of the object depicted in the input.

For example, the encoder 206 can perform feature encoding from an input and can compute derived values, i.e., a set of features, intended to be informative about properties of the input. Given an input image 202, the encoder 206 can calculate a latent space representation 207, i.e., a set of features, that represent the "X" shape of the input. In this way, the encoder maps the "X" shaped object to a latent space, representing the input image with a low-dimensional representation.

The encoder 206 can be a convolutional neural network (CNN) that includes a plurality of convolutional layers. In some implementations, the encoder 206 can use a ResNet style CNN (He, Kaiming, et al. "Deep residual learning for image recognition." Proceedings of the IEEE conference on computer vision and pattern recognition. 2016). For example, the encoder 206 can use ResNet18 which has 18 convolutional layers and fully connected layers. The fully connected layers can be configured to generate a latent representation 207, with a set of features of 1×256 dimensions.

The decoder neural network 208 can be configured to generate, from the latent representation 207, an output that defines a convex representation of the object 201 that includes a plurality of convex elements. In some implementations, the decoder 208 can take the low-dimensional latent representation 207 of the object as an input and can generate a plurality of parameters 210 that define a convex representation of the object 201. The parameters 210 are generated from a plurality of output layers of the decoder neural network 208.

The convex representation of the input object can include an indicator function. An indicator function is defined to indicate whether a point is inside an object or outside an object. During training, random sample points can be evaluated using the indicator function, and an evaluation result can be compared with the input object such that the convex decomposition is an approximation to the input object. The indicator function representation is a differentiable convex decomposition, and can be calculated using a neural network, e.g., an encoder-decoder neural network that is trained in an end-to-end fashion.

For example, an indicator function O(x) can be defined to satisfy that $\{x \in R^3 | O(x)=0\}$ defines the outside of an object, and $\{x \in R^3 | O(x)=1\}$ defines the inside of the object, and $00=\{x \in R^3 | O(x)=0.5\}$ indicates the surface of the object. Given an input, e.g., an image, point cloud, or voxel grid, a network 200 can be configured to estimate the parameters of a predicted indicator function $\hat{O}(\bullet)$ with K convex elements indexed by k. During training, the predicted indicator function $\hat{O}(\bullet)$ can be evaluated at randomly sampled points x. Each randomly sampled point can be inside the object or outside the object. A training loss can measure the difference between a predicted indicator value $\hat{O}(x)$ and a ground-truth indicator value O(x). This training loss can ensure the convex decomposition is a good approximation of the input object, i.e., $\hat{O}(x) \approx O(x)$.

A convex representation of the object can include a plurality of convex elements. Each convex element can be represented by an indicator function. The indicator function of the object can be formulated by a plurality of indicator functions 212 for the plurality of convex elements 214.

For example, a heat map plot 216 shows an indicator function of an "X" shaped reconstructed object obtained by a convex deposition. The heat map plot 216 shows regions that are inside 218 the "X" shaped reconstructed object and regions that are outside 219 the "X" shaped reconstructed object, and a transition band around the boundary of the "X" shaped reconstructed object. Accordingly, for each convex element, a heat map plot (one of 220, 222, 224 and 226) of an indicator function corresponding to a convex element shows inside regions and outside regions.

An indicator function of an object can be a mathematical function of the indicator functions of the convex elements. For example, an indicator function of an object can be formulated as $$\hat{O}(x) = \max_k \{C_k(x)\}, \qquad (1)$$

and $C_k(x)=C(T_k(x)|\beta_k)$ is an indicator function of the k-th convex element. The application of the max operator can produce a union of all the indicator functions for all the K convex elements.

An indicator function of a convex element can be defined by a set of parameters. The decoder 208 can be configured to generate a collection of K sets of parameters 210 for K convex elements 214. The total number of convex elements K can be predetermined or can be determined by the neural network. Each set of parameters can include a shape parameter $\beta_k$ and a pose parameter $T_k$. The shape parameter $\beta_k$ and the pose parameter $T_k$ can define an indicator function 212 of a convex element.

For example, the convex representation of the "X" shaped object 201 can include four convex elements shown as four heat map plots 220, 222, 224 and 226. The neural network 200 can be configured to represent the "X" shaped object 201 by using K convex elements, where K=4. The parameters 210 includes K sets of parameters $\{(\beta_1, T_1), (\beta_2, T_2), (\beta_3, T_3), \ldots, (\beta_K, T_K)\}$. Each set of parameters $(\beta_k, T_k)$ defines the corresponding k-th convex element using an indicator function $C(T_k(x)|\beta_k)$.

The shape parameter $\beta_k$ can include parameters that define a shape of each convex element. The shape of each convex element can be defined by a plurality of halfspaces. Generally, a large set of halfspaces can represent any convex element. The neural network 200 can be configured to define a shape of each convex element using H halfspaces.

Each halfspace can be defined by a normal parameter $n_h$ and an offset parameter $d_h$, where h indicates that the halfspace is the h-th halfspace among a set of halfspaces. For example, for a halfspace in 2D, i.e., a straight line, the normal parameter can be related to the slope or the gradient of the line, and the offset parameter can be related to the y-intercept of the line. The shape parameter $\beta_k$ can include a collection of halfspace parameters for all H halfspaces that defines the shape of the k-th convex element.

A signed distance from a point x to the h-th halfspace can be defined as:

$$H_h = n_h \cdot x + d_h. \tag{2}$$

Given a large number of H halfspaces, the signed distance function of any convex element can be approximated by taking the intersection of the signed distance functions of the halfspaces.

Given a collection of halfspace parameters, an indicator function of a convex element can be formulated. The indicator function of a convex element is differentiable and can be evaluated at any position x.

For example, an indicator function of a convex element can be $$C(\beta) = \mathrm{Sigmoid}(-\sigma(x)) \tag{3}$$

and $(x)=\mathrm{Log\ SumExp}\{\delta H_h(x)\}$ is an approximate signed distance function.

Log SumExp(•), also can be called softmax function, is a smooth maximum function and is used here to facilitate gradient learning. Sigmoid(•) is a Sigmoid function having an "S" shaped curve, taking all real numbers as an input, returning values between 0 and 1. The soft classification boundary created by the Sigmoid function can help gradient learning. The parameter δ can control the smoothness of the generated convex and the hyper-parameter σ can control the sharpness of the transition of the indicator function. For example, the hyper-parameter σ can be equal to 75. The indicator function in (3) can generate a smooth reconstruction of an object.

In some implementations, a convex decomposition of an input object can be generated to reconstruct and recover sharp geometric features of the input object. For example, it may be desirable to represent the sharp edge of a table using convex elements that have sharp edges. Therefore, the indicator function of the object can use a low-poly reconstruction of the object with sharp features, such as using a small number of polygons.

For example, to group H halfspaces into a polygonal convex element, an indicator function of the j-th convex element in a set of convex elements can be $$C_k^*(x) = (H_h M_{hk}) \tag{4}$$

and $H_h$ is a signed distance from a point x to the h-th halfspace and $M_{hk}$ is an element of a binary matrix M that aggregates halfspaces into convex elements. Here, instead of using a Log SumExp(•) function, a max function is used in order to reconstruct sharp features of the input object.

The pose parameter $T_k$ can include parameters that define the pose of each convex element using an affine transformation, e.g., a translation, and/or a rotation of each convex element, etc. For example, for the k-th convex element, a translation $T_k(x) = x + c_k$ can transform a point x from world coordinates to local coordinates of the k-th convex element. The pose parameter $T_k$ can include $c_k$ which is a predicted translation vector generated by the network 200.

For example, the first convex element shown in a heat map plot 220 can represent a lower right part of the "X" shaped object 201. The origin of the local coordinates of a convex element shown in the heat map plot 220 is different from the origin of the world coordinate of the entire object 201. With the pose parameter $T_k$, a translation $T_k(x) = x + c_k$ can transform a point x from world coordinate to local coordinates of the convex element shown in the heat map plot 220.

Given the shape parameter $\beta_k$ and the pose parameter $T_k$, an indicator function 212 of the k-th convex element can be formulated as $C(T_k(x)|\beta_k)$.

The decoder neural network 208 can be a convolutional neural network that includes a plurality of convolutional layers, deconvolutional layers and fully connected layers. For example, for a 3D object, an indicator function of the object Ô(•) can include K=50 convex elements, and each convex element can include H=50 halfspaces. The decoder 208 can use a sequential model with four fully connected layers with (1024, 1024, 2048, |H|) units respectively. An output dimension of the decoder neural network 208 can be |H|=K(4+3H). For each of the K convex elements, the respective output parameters can include a translation parameter (3 values in x, y, z) and a smoothness parameter δ. Each halfspace can be specified by a unit normal parameter and an offset parameter from the origin.

The indicator functions 212 defined by the output parameters 210 from the decoder neural network 208 can be used differently during training of the neural network 200 and during a convex decomposition process. During a convex decomposition process, the indicator functions can be used to reconstruct an object and are usable in applications that require a polygonal representation of the object. When training the neural network 200, a training engine can train the encoder neural network and the decoder neural network end-to-end to minimize a loss function that measures how well the indicator functions 212 approximate a ground-truth indicator function of the input object 201.

Figure 3:
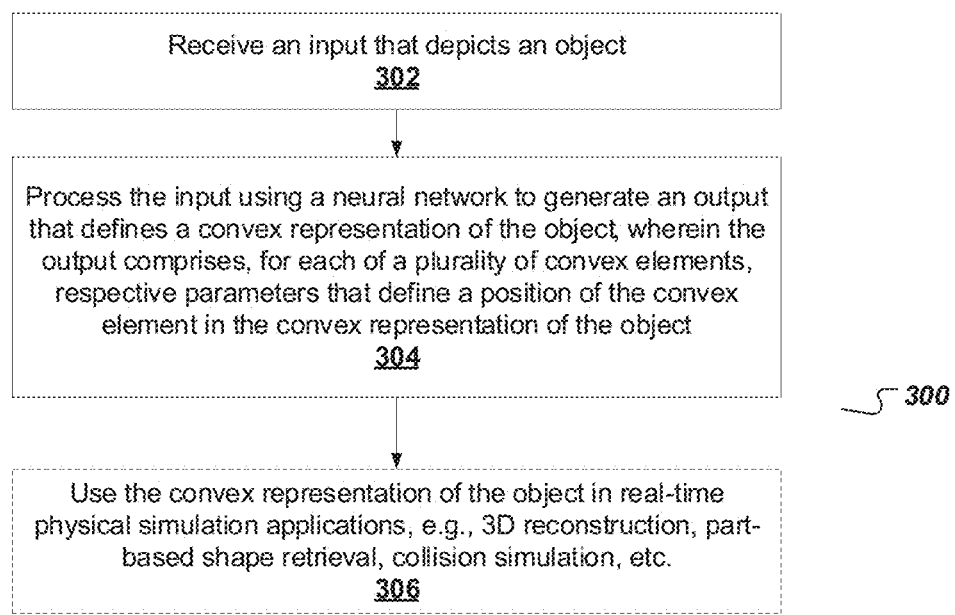
FIG. 3 is a flowchart of an example process for generating a convex representation of an object.

FIG. 3 is a flowchart of an example process 300 for generating a convex representation of an object. For convenience, the process 300 will be described as being performed by a system of one or more computers located in one or more locations. For example, the system 100 of FIG. 1, appropriately programmed in accordance with this specification, can perform the process 300.

The system receives an input that depicts an object (302). The input can be a representation of the object in any format, e.g., an image of the object, a point cloud of the object, a voxel grid of the object, etc. The object can be a generic non-convex object, and the shape of the object is depicted in the input.

The system processes the input using a neural network to generate an output that defines a convex representation of the object (304). The convex representation of the object can include a plurality of convex elements. The system can generate parameters that define a position of a convex element in the convex representation of the object.

In some implementations, the neural network can have an encoder-decoder architecture that includes an encoder neural network and a decoder neural network. The encoder neural network can be configured to receive the input and to generate a low-dimensional latent representation of the input. The decoder neural network can be configured to generate, from the low-dimensional latent representation of the input, an output that defines the convex representation of the object.

In some implementations, the output that defines a convex representation of the object can include parameters of a predicted indicator function of the object. An indicator function can define an inside region of the object and an outside region of the object.

A generic non-convex object can be represented as compositions of convex elements. To achieve this task, the system can use the encoder neural network to generate a low-dimensional latent representation of all K convex elements, and the system can use the decoder neural network to process the latent representation and can generate K sets of parameters.

In some implementations, the system can configure the decoder neural network to generate parameters that define an indicator function of a convex element. Each set of parameters representing a convex element can include a predetermined number of shape parameters and a predetermined number of pose parameters that can define an indicator function of a convex element.

In some implementations, the shape of a convex element can be defined by a predetermined number of halfspaces. The system can configure the decoder neural network to generate a plurality of sets of parameters for the predetermined number of halfspaces. In some implementations, each set of parameters can include a normal parameter and an offset parameter that define a halfspace. The normal parameter and the offset parameter of the halfspace can define a signed distance function that measures distance from a point to the halfspace.

In some implementations, the system can configure the encoder-decoder neural network to generate parameters that define a predetermined number of convex elements. The system can generate a convex representation of the object using the convex elements defined by the parameters generated from the encoder-decoder neural network.

The convex representation can be a low-dimensional representation that includes a small number of convex elements. The convex representation can be automatically inferred from an input, without any human supervision. Each of the convex elements can be a general class of convexes with any shape, without being restricted to belong to a certain class, such as boxes, ellipsoids, or sphere-meshes, etc.

In some implementations, the system can use the convex representation of the object in real-time computer graphics applications (306) where an explicit representation of a surface is required. Examples of real-time computer graphics applications can include 3D reconstruction, part-based shape retrieval, collision simulation, etc.

In some implementations, the system can process the convex decomposition and generate an explicit representation of the object, such as a polygonal mesh. For example, the system can derive a polygonal mesh by computing the vertices of a convex hull of points that are generated from the halfspaces. The convex-hull can be used by physical engines to simulate animations of a movement of one or more objects.

Figure 4:
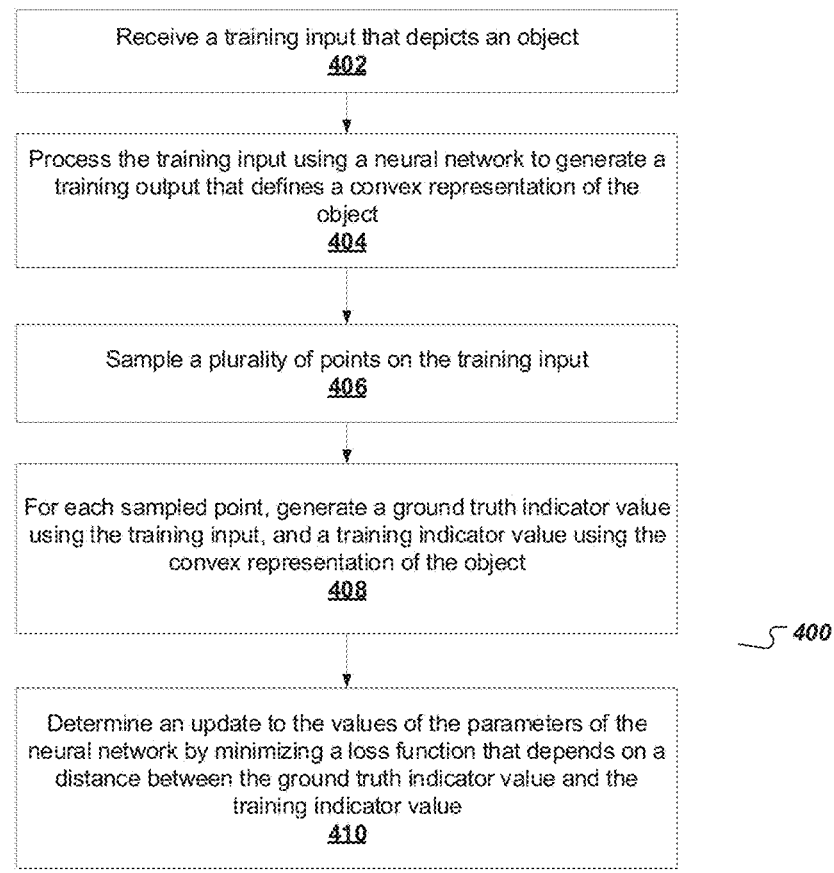
FIG. 4 is a flowchart of an example process for training a neural network that can generate a convex representation of an object.

FIG. 4 is a flowchart of an example process 400 for training a neural network that can generate a convex representation of an object. For convenience, the process 400 will be described as being performed by a system of one or more computers located in one or more locations. For example, the system 100 of FIG. 1, appropriately programmed in accordance with this specification, can perform the process 400. The training process is in a self-supervised manner and can predict shapes of convex elements as well as their poses and locations by checking whether a reconstructed geometry matches a geometry of a target object.

The system receives a training input that depicts an object (402). The training input can be one of an image of the object, a point cloud of the object, or a voxel grid of the object. The object can be a generic non-convex object, and the shape of the object is depicted in the input. In some implementations, the training input can include a plurality of representations for a plurality of objects. These objects can belong to different object classes and can be jointly used to train the neural network. For example, the training input can include images of chairs, desks, airplanes, cars, etc.

The system processes the training input using a neural network to generate a training output that defines a convex representation of the object (404). A convex representation of the object can include a plurality of convex elements. In some implementations, each convex element can be defined by a plurality of halfspaces.

In some implementations, the training output can include parameters that define a training indicator function of the object. Given a point x, the training indicator function can calculate a training indicator value indicating whether the point x is inside a convex representation or outside a convex representation. The training indicator function is an implicit representation and can be defined by a signed distance function of a plurality of halfspaces. This implicit representation can be a differentiable convex decomposition and can be used for neural network training.

The system samples a plurality of points on the training input (406). The system can sample the plurality of points uniformly on the training input, or randomly on the training input. In a 2D example, the plurality of points can be sampled randomly on pixels of an input image. For 3D objects, the samples can be obtained randomly in the 3D object in a 3D space. The sampled points can include points that are inside the object, outside the object, or on the boundary of the object.

For each sampled point, the system generates a ground truth indicator value using the training input, and a training indicator value using the convex representation of the object (408).

The ground truth indicator value can represent whether a sampled point is inside or outside the object. For example, a ground truth indicator value can be a binary value, with 0 indicating the point is outside the object, and 1 indicating the point is inside the object. For a binary image, such as the image 202 in FIG. 2, the ground truth value of a sample point can be the pixel value of a pixel that corresponds to the sampled point.

In some implementations, the system can sample a set of points on the training input offline, and can precompute a ground truth indicator value that indicates whether the point is inside the object, and can then randomly subsample from this set during training. This method can greatly speed-up the training process.

The training indicator value can represent whether a sampled point is inside or outside the convex representation of the object defined by an output of the neural network. For example, a training indicator value can be calculated using an indicator function of the object defined by the output parameters. In some implementations, the training indicator value can be a number that is between 0 and 1.

The system determines an update to the values of the parameters of the neural network by minimizing a loss function (410). The loss function can be defined based on a distance between the ground truth indicator value and the training indicator value calculated from the sampled points.

The system can use a loss function that encourages good approximation between an object and a convex decomposition of the object. For example, a ground truth indicator value of a sampled point x can be $O(x)$, and a training indicator value of the sampled point x can be $\hat{O}(x)$. The training loss function that measures a distance between the ground truth indicator value and the training indicator value can be formulated as an approximation loss:

$$L_{approx}(\omega) = E_{x \sim R^3} \|\hat{O}(x) - O(x)\|^2. \quad (5)$$

where $\omega$ are the parameters of the neural network.

The system can train the convex decomposition neural network model to determine trained values of the parameters of the neural network from initial values of the parameters by repeatedly performing a neural network training procedure. The neural network training procedure can compute a gradient of the loss function with respect to the parameters of the neural network model, e.g., using backpropagation, and can determine updates to the parameters from the gradient, e.g., using the update rule corresponding to the neural network training procedure.

In some implementations, in addition to the approximation loss, the system can use one or more other auxiliary losses that enforce the desired properties of the resulting convex decomposition.

In some implementations, the system can use a loss function that further includes a decomposition loss that measures an overlap between a plurality of convex elements. The overlap between convex elements, e.g., the region 215 in FIG. 2 should be discouraged in order to generate a simple and clean convex decomposition. Minimizing the decomposition loss can reduce the amount of overlap between convex elements.

In some implementations, the system can use a loss function that further includes a unique parameterization loss. While each convex element can be parameterized with respect to the origin, there can be multiple solutions that correspond to the same convex decomposition, which are also called "null-space" of solutions. For example, the system can generate a null-space solution by moving the origin to another location within a convex, and then updating the offsets $d_h$ and transformation T accordingly. To remove such null-space of solutions, the system can use a unique parameterization loss to limit and regularize the magnitudes of the offsets for each of the H halfspaces that defines each of the K convex elements.

In some implementations, the system can use a loss function that further includes a guidance loss. A guidance loss can ensure that each convex element is responsible for representing a certain amount of interior samples and can help the convergence of the training process. For example, the guidance loss can ensure that each convex element is responsible for representing at least the N closest interior samples.

The system can use a group of appropriate hyper-parameters and optimization methods to determine an update to the values of the parameters of the neural network. For example, the system can use a batch size of 32 and Adam optimization with a learning rate of 0.0001, $\beta_1=0.9$, and $\beta_2=0.999$. The loss function can be a weighted sum of several kinds of losses. For example, the weights for the approximation loss, the decomposition loss, the unique parameterization loss, and the guidance loss can be 1.0, 0.1, 0.001, and 0.01, respectively.

This specification uses the term "configured" in connection with systems and computer program components. For a system of one or more computers to be configured to perform particular operations or actions means that the system has installed on its software, firmware, hardware, or a combination of them that in operation cause the system to perform the operations or actions. For one or more computer programs to be configured to perform particular operations or actions means that the one or more programs include instructions that, when executed by a data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a standalone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

In this specification, the term "database" is used broadly to refer to any collection of data: the data does not need to be structured in any particular way, or structured at all, and it can be stored on storage devices in one or more locations. Thus, for example, the index database can include multiple collections of data, each of which may be organized and accessed differently.

Similarly, in this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back end component, e.g., as a data server, or that includes a middleware component, e.g., an application server, or that includes a front end component, e.g., a client computer having a graphical user interface, a web browser, or an app through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A computer-implemented method, comprising:
   receiving an input that depicts an object; and
   processing the input using a neural network to generate an output that defines a convex representation of the object, wherein the output comprises, for each of a plurality of convex elements, respective parameters that define a position of the convex element in the convex representation of the object, wherein each of the convex elements is defined by a plurality of halfspaces, and wherein the respective parameters comprise, for each of the halfspaces:
   parameters that define a normal $n_h$ and an offset $d_h$ such that $H_h = n_h \cdot x + d_h$ is a signed distance from a point x to the h-th halfspace defined with the normal $n_h$ and the offset $d_h$.

2. The computer-implemented method of claim 1, wherein the neural network comprises:
   an encoder neural network that is configured to receive the input and to generate a low-dimensional latent representation of the input, and
   a decoder neural network that is configured to generate the output that defines the convex representation of the object.

3. The computer-implemented method of claim 1, wherein for each of the convex elements, the respective parameters comprise:
   parameters that define an indicator function for the convex element.

4. The computer-implemented method of claim 1, wherein the respective parameters further comprise, for each of the plurality of convex elements, pose parameters $T_k$ that define an affine transformation that transforms a point from world coordinates to local coordinates of the k-th convex element.

5. The computer-implemented method of claim 1, wherein the input is one of an image of the object, a point cloud of the object, or a voxel grid of the object.

6. The computer-implemented method of claim 1, further comprising:
   using the convex representation of the object in applications where an explicit representation of a surface is required.

7. A method of training a neural network that receives an input that depicts an object and processes the input to generate an output that defines a convex representation of the object, wherein the output comprises, for each of a plurality of convex elements, respective parameters that define a position of the convex element in the convex representation of the object, the method comprising:
   receiving a training input that depicts an object;
   processing the training input using the neural network to generate a training output that defines a convex representation of the object;
   sampling a plurality of points on the training input;
   for each sampled point, generating a ground truth indicator value using the training input, and a training indicator value using the convex representation of the object, wherein the ground truth indicator value determines whether the sampled point lies inside the object, and wherein the training indicator value determines whether the sampled point lies inside the convex representation of the object; and
   determining an update to values of parameters of the neural network by minimizing a loss function that depends on a distance between the ground truth indicator value and the training indicator value.

8. The method of claim 7, wherein the loss function further comprises a decomposition loss that measures overlap between the plurality of convex elements.

9. The method of claim 7, wherein each of the convex elements is defined by a plurality of halfspaces, and wherein the respective parameters comprise, for each of the halfspaces, parameters that define a normal $n_h$, and an offset $d_h$.

10. The method of claim 9, wherein the loss function further comprises a unique parameterization loss that measures, for each of the plurality of convex elements, magnitudes of offsets $d_h$ for each of the halfspaces.

11. The method of claim 7, wherein the loss function further comprises a guidance loss that ensures each convex element is responsible for representing a certain amount of interior samples.

12. A system comprising:
    one or more computers and one or more storage devices storing instructions that are operable, when executed by the one or more computers, to cause the one or more computers to perform operations comprising:
    receiving an input that depicts an object; and
    processing the input using a neural network to generate an output that defines a convex representation of the object, wherein the output comprises, for each of a plurality of convex elements, respective parameters that define a position of the convex element in the convex representation of the object, wherein each of the convex elements is defined by a plurality of halfspaces, and wherein the respective parameters comprise, for each of the halfspaces: parameters that define a normal $n_h$ and an offset $d_h$ such that $H_h = n_h \cdot x + d_h$ is a signed distance from a point x to the h-th halfspace defined with the normal $n_h$ and the offset $d_h$.

13. The system of claim 12, wherein the neural network comprises:
    an encoder neural network that is configured to receive the input and to generate a low-dimensional latent representation of the input, and
    a decoder neural network that is configured to generate the output that defines the convex representation of the object.

14. The system of claim 12, wherein for each of the convex elements, the respective parameters comprise:
    parameters that define an indicator function for the convex element.

15. The system of claim 12, wherein the respective parameters further comprise, for each of the plurality of convex elements, pose parameters $T_k$ that define an affine transformation that transforms a point x from world coordinates to local coordinates of the k-th convex element.

16. The system of claim 12, wherein the input is one of an image of the object, a point cloud of the object, or a voxel grid of the object.

17. The system of claim 12, the operations further comprise:
    using the convex representation of the object in applications where an explicit representation of a surface is required.

18. A computer program product, encoded on one or more non-transitory computer storage media, comprising instructions that when executed by one or more computers cause the one or more computers to perform operations comprising:
    receiving an input that depicts an object; and
    processing the input using a neural network to generate an output that defines a convex representation of the object, wherein the output comprises, for each of a plurality of convex elements, respective parameters that define a position of the convex element in the convex representation of the object, wherein each of the convex elements is defined by a plurality of halfspaces, and wherein the respective parameters comprise, for each of the halfspaces: parameters that define a normal $n_h$ and an offset $d_h$ that $H_h = n_h \cdot x + d_h$ is a signed distance from a point x to the h-th halfspace defined with the normal $n_h$ and the offset $d_h$.

19. A computer-implemented method, comprising:
    receiving an input that depicts an object; and
    processing the input using a neural network to generate an output that defines a convex representation of the object, wherein the output comprises, for each of a plurality of convex elements, respective parameters that define a position of the convex element in the convex representation of the object, wherein the respective parameters comprise, for each of the plurality of convex elements, pose parameters $T_k$ that define an affine transformation that transforms a point x from world coordinates to local coordinates of the k-th convex element.

20. The computer-implemented method of claim 19, wherein the neural network comprises:
    an encoder neural network that is configured to receive the input and to generate a low-dimensional latent representation of the input, and
    a decoder neural network that is configured to generate the output that defines the convex representation of the object.

21. The computer-implemented method of claim 19, wherein for each of the convex elements, the respective parameters comprise:
    parameters that define an indicator function for the convex element.

22. The computer-implemented method of claim 19, wherein each of the convex elements is defined by a plurality of halfspaces, and wherein the respective parameters comprise, for each of the halfspaces:
    parameters that define a normal $n_h$ and an offset $d_h$ such that $H_h = n_h \cdot x + d_h$ is a signed distance from a point x to the h-th halfspace defined with the normal $n_h$ and the offset $d_h$.

23. The computer-implemented method of claim 19, wherein the input is one of an image of the object, a point cloud of the object, or a voxel grid of the object.

24. The computer-implemented method of claim 1, further comprising:
    using the convex representation of the object in applications where an explicit representation of a surface is required.

25. A system comprising:
    one or more computers and one or more storage devices storing instructions that are operable, when executed by the one or more computers, to cause the one or more computers to perform operations comprising:
    receiving an input that depicts an object; and
    processing the input using a neural network to generate an output that defines a convex representation of the object, wherein the output comprises, for each of a plurality of convex elements, respective parameters that define a position of the convex element in the convex representation of the object, wherein the respective parameters comprise, for each of the plurality of convex elements, pose parameters $T_k$ that define an affine transformation that transforms a point x from world coordinates to local coordinates of the k-th convex element.

26. The system of claim 25, wherein the neural network comprises:
    an encoder neural network that is configured to receive the input and to generate a low-dimensional latent representation of the input, and
    a decoder neural network that is configured to generate the output that defines the convex representation of the object.

27. The system of claim 25, wherein for each of the convex elements, the respective parameters comprise:
    parameters that define an indicator function for the convex element.

28. The system of claim 25, wherein each of the convex elements is defined by a plurality of halfspaces, and wherein the respective parameters comprise, for each of the halfspaces:
    parameters that define a normal $n_h$ and an offset $d_h$ such that $H_h = n_h \cdot x + d_h$ is a signed distance from a point x to the h-th halfspace defined with the normal $n_h$ and the offset $d_h$.

29. The system of claim 25, wherein the input is one of an image of the object, a point cloud of the object, or a voxel grid of the object.

30. The system of claim 25, the operations further comprise:

using the convex representation of the object in applications where an explicit representation of a surface is required.

31. A computer program product, encoded on one or more non-transitory computer storage media, comprising instructions that when executed by one or more computers cause the one or more computers to perform operations comprising:

receiving an input that depicts an object; and processing the input using a neural network to generate an output that defines a convex representation of the object, wherein the output comprises, for each of a plurality of convex elements, respective parameters that define a position of the convex element in the convex representation of the object, wherein the respective parameters comprise, for each of the plurality of convex elements, pose parameters $T_k$ that define an affine transformation that transforms a point from world coordinates to local coordinates of the k-th convex element.

* * * * *